United States Patent [19]
Kwon et al.

[11] Patent Number: 6,115,298
[45] Date of Patent: Sep. 5, 2000

[54] SEMICONDUCTOR DEVICE WITH AUTOMATIC IMPEDANCE ADJUSTMENT CIRCUIT

[75] Inventors: Ig-Soo Kwon, Kyunggi-do; Yong-Jin Yoon, Seoul, both of Rep. of Korea

[73] Assignee: Samsung Electronics Co., Ltd., Suwon, Rep. of Korea

[21] Appl. No.: 09/223,174

[22] Filed: Dec. 30, 1998

[30] Foreign Application Priority Data

Dec. 31, 1997 [KR] Rep. of Korea ............. 97-81003

[51] Int. Cl.⁷ .................................................. G11C 7/00
[52] U.S. Cl. ............................................ 365/198; 365/191
[58] Field of Search ........................... 365/198, 191; 326/30

[56] References Cited

U.S. PATENT DOCUMENTS

| | | | |
|---|---|---|---|
| 5,808,478 | 9/1998 | Andresen | 326/31 |
| 5,898,321 | 4/1999 | Ilbahar et al. | 326/87 |
| 5,939,953 | 8/1999 | Yo Go et al. | 333/17.3 |

*Primary Examiner*—David Nelms
*Assistant Examiner*—Tuan T. Nguyen
*Attorney, Agent, or Firm*—Jones Volentine, L.L.P.

[57] ABSTRACT

A semiconductor device connected to a bus consisting of a plurality of signal lines, comprises a first pad connected with a discrete resistor corresponding to the impedance of the signal lines, a plurality of second pads respectively connected with the signal lines, a reference voltage generator for generating a reference voltage, a comparator for comparing the voltage on the first pad with the reference voltage to generate a control signal, a code generator for generating a code signal according to the control signal, a current source for supplying the first pad with variable current according to the code signal, and a data driver for driving data signals to the signal lines connected with the second pads according to the code signal. The code signal is used to match the impedance of the data driver with the impedance of the signal lines.

14 Claims, 7 Drawing Sheets

SEMICONDUCTOR DEVICE WITH AUTOMATIC IMPEDANCE ADJUSTMENT CIRCUIT

This application relies for priority upon Korean Patent Application No. 97-81003, filed on Dec. 31, 1997, the contents of which are herein incorporated by reference in their entirety.

FIELD OF THE INVENTION

The present invention concerns a semiconductor device with an impedance adjustment circuit for matching the impedance of a data driver with the impedance of each of a plurality of signal lines of the bus.

BACKGROUND OF THE INVENTION

Since signal reflection errors are increased with the development of ultrahigh speed synchronous semiconductor memory devices, it becomes more important to match the impedance of interface circuits, such as data driver circuits, with the impedances of the signal lines of a bus in order to prevent reflection errors during the transferring of high frequency signals. When designing a printed circuit board (PCB), discrete resistors (or external resistors) are also provided, corresponding to the impedances of the signal lines of the bus connected to the semiconductor memory device. In this way, the impedance of the interface circuit of the device is automatically matched with the impedances of the bus according to the values of the discrete resistors. To this end, an impedance adjustment circuit is provided in the ultrahigh speed synchronous device.

FIG. 1 shows the ($V_{DS}$-$I_{DS}$) relationship of a MOS transistor, and FIG. 2 the variation of the operating point of the MOS transistor with the resistor values corresponding to the impedances of the bus. When designing the PCB, it must be determined whether the impedances of the signal lines of the bus are matched with the impedances of the respective data driver circuits. In other words, the impedance of each data driver circuit is measured under the designing voltage, e. g., $V_{DD}/2$. In this case, the on-resistance of the MOS transistor constituting the data driver circuit is determined at the operating point of $V_{DD}/2$, as shown in FIG. 1, where $V_{DD}/2$ represents the power source of the data driver circuit.

The impedance adjustment circuit has a transistor array consisting of MOS transistors to adjust the impedance of the data driver circuit. As the value of the discrete resistor connected to the impedance adjustment circuit varies, the operating point of the MOS transistors of the transistor array change their position from "b" ($V_{DD}/2$) to either "a" or "c". Hence, while the impedance of the data driver circuit is determined under a designing voltage ($V_{DD}/2$), the impedance of the transistor array is determined under the different voltages ("a" or "c"). This may cause the impedance of the data driver circuit determined by the impedance adjustment circuit to differ from the signal impedance of the bus, thereby increasing the transmitted signal reflection.

SUMMARY OF THE INVENTION

It is an object of the present invention to provide a semiconductor device with an impedance adjustment circuit for matching the impedance of the data driver circuit with the signal line impedance of the bus.

According to an aspect of the present invention, a semiconductor device connected to a bus having a plurality of signal lines is provided. The semiconductor device comprises: a resistor having a first end connected to a ground voltage, a first pad connected to a second end of the resistor, a plurality of second pads respectively connected to the plurality of signal lines, a reference voltage generator for generating a reference voltage, a comparator for comparing the voltage at the first pad with the reference voltage to generate a control signal, a code generator for generating a code signal in response to the control signal, a current source for supplying the first pad with a variable current in accordance with the code signal, and a data driver for driving data signals onto the signal lines via the second pads in accordance with the code signal.

The resistor may be a discrete resistor, and it preferably has a value corresponding to the impedance of the plurality of signal lines. The code signal is used to match the impedance of the data driver with the impedance of the signal lines.

The code generator may include an up/down counter for generating the code signal, and the code signal preferably has at least two binary logic values.

The reference voltage generator may further comprise a first source terminal for receiving a source voltage, a second source terminal for receiving a ground voltage, an output terminal for outputting the reference voltage, a first transistor array controlled by the binary logic values, a plurality of inverters for inverting the binary logic values, and a second transistor array controlled by the inverted binary logic values. The first transistor array may further comprise a plurality of first MOS transistors connected in parallel between the output terminal and the second source terminal, and the second transistor array may further comprise a plurality of second MOS transistors connected in parallel between the first source terminal and the output terminal. The first MOS transistors are preferably NMOS transistors, and the second MOS transistors are preferably PMOS transistors. The ratio between the NMOS and PMOS transistors is preferably 1:1 and pairs of the NMOS and PMOS transistors preferably have the same on-resistance. Each of the NMOS transistors preferably have different widths, and each of the PMOS transistors preferably have different widths.

The current source may further comprise source PMOS transistors connected in parallel between the first source terminal and the first pad, and the source PMOS transistors are respectively controlled by the outputs of the plurality of inverters. The source PMOS transistors preferably each have different widths.

The data driver may further comprise a plurality of data driver circuits connected in parallel with the plurality of second pads. The data driver circuits are preferably controlled by the logic values of the code signal.

According to another aspect of the present invention, a semiconductor device connected to a bus having of a plurality of signal lines is provided. The semiconductor device comprises a discrete resistor corresponding to the impedance of the signal lines, a first pad connected to the discrete resistor, a plurality of second pads respectively connected with the signal lines, an impedance adjustment circuit connected to the first pad to generate a code signal according to the value of the discrete resistor, and a data driver for driving data signals to the signal lines in response to the code signal, the impedance of the data driver being adjusted to have the same value as that of the signal lines.

The impedance adjustment circuit may further comprise a reference voltage generator for generating a reference voltage, a current source for supplying the first pad with variable current according to the code signal, a comparator for comparing the voltage at the first pad with the reference voltage to generate a control signal, and a code generator for generating the code signal in accordance with the control signal.

The present invention will now described more specifically with reference to the attached drawings by way of example.

BRIEF DESCRIPTION OF THE ATTACHED DRAWINGS

DESCRIPTION OF THE PREFERRED EMBODIMENTS

In accordance with a preferred embodiment of the present invention, a semiconductor device is provided that includes an impedance adjustment circuit to match the impedance of the data driver circuit with the signal line impedance of a bus.

Figure 3:
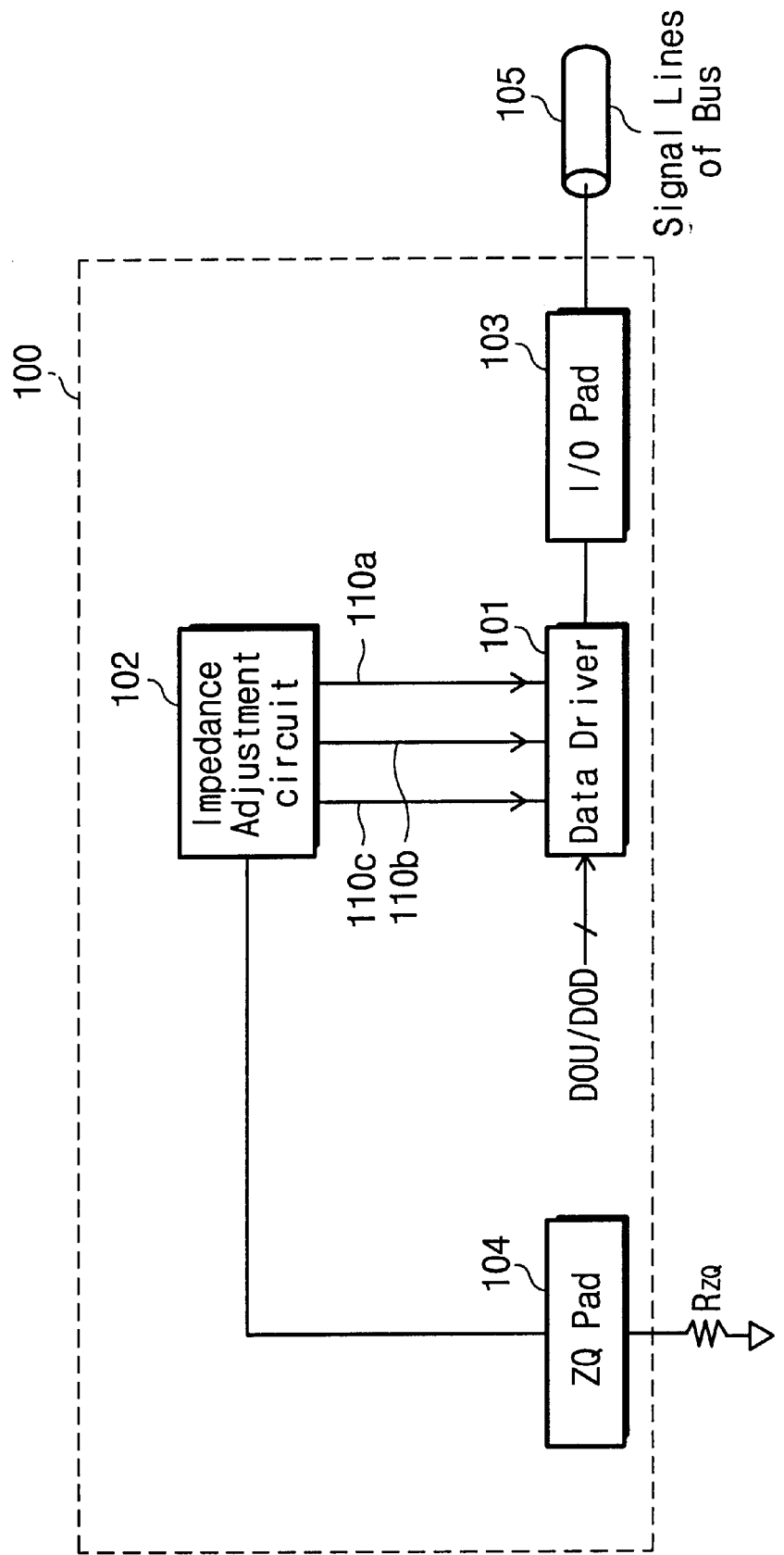
FIG. 3 is a block diagram illustrating the structure of a semiconductor device with an inventive impedance adjustment circuit according to a preferred embodiment of the present invention.

Referring to FIG. 3, a high speed synchronous semiconductor memory device 100 is connected to a discrete resistor $R_{ZQ}$ and the signal lines of a bus 105. The semiconductor memory device includes a data driver 101, an impedance adjustment circuit 102, an input/output pad 103, and a ZQ pad 104. The data driver 101 is connected with the input/output pad 103 and the impedance adjustment circuit 102. The impedance adjustment circuit 102 is itself connected with a ZQ pad 104.

While the input/output pad 103 is disclosed as a single output pad, it can also be considered as a plurality of individual output pads, each connected to the signal lines of the bus 105.

The ZQ pad 104 is connected to the discrete resistor $R_{ZQ}$, whose resistance value corresponds to the impedance of each signal line of the bus 105. This resistance value is determined during design, and is typically five times the impedance of the data driver 101. For example, the value of the discrete resistor $R_{ZQ}$ would be 250 Ω for a signal line impedance of 50 Ω, and would be 175 Ω for a signal line impedance of 35Ω.

The data driver 101 drives the data DOU/DOD to the signal line 105 of the bus via the I/O pad 103. The data signals DOU and DOD are complementary signals detected by a sense amplifier (not shown) from a selected cell of a memory cell array (not shown). The data DOU/DOD is amplified by the data driver 101 before it is sent to the signal lines of the bus 105. However, when the impedance of the data driver 101 is not matched with that of the bus signal line, reflection errors may be in introduced.

Figure 1:
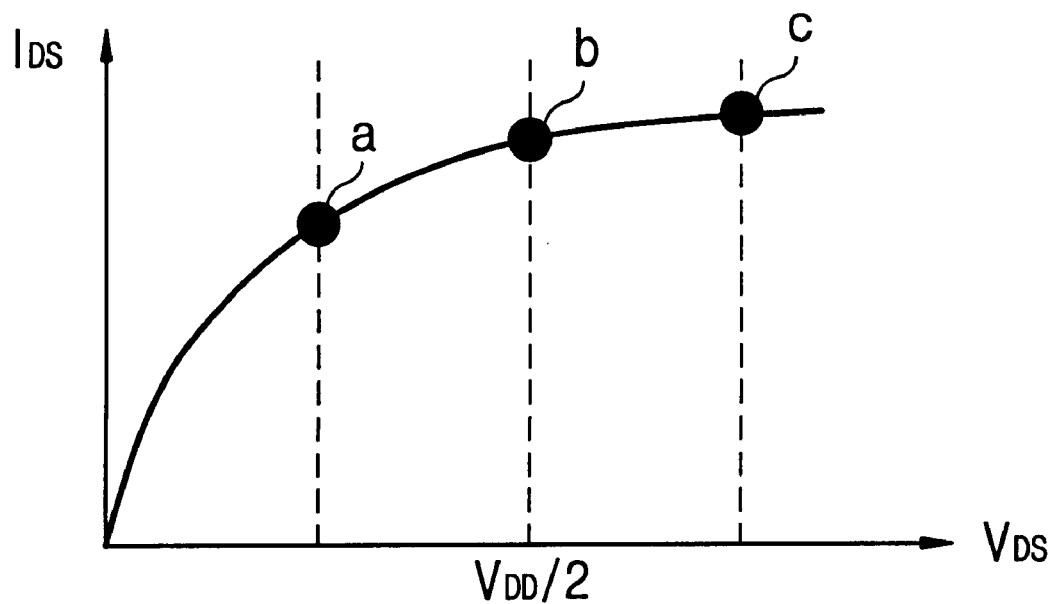
FIG. 1 is a graph for illustrating the relationship between $V_{DS}$ and $I_{DS}$ of a MOS transistor.
Figure 2:
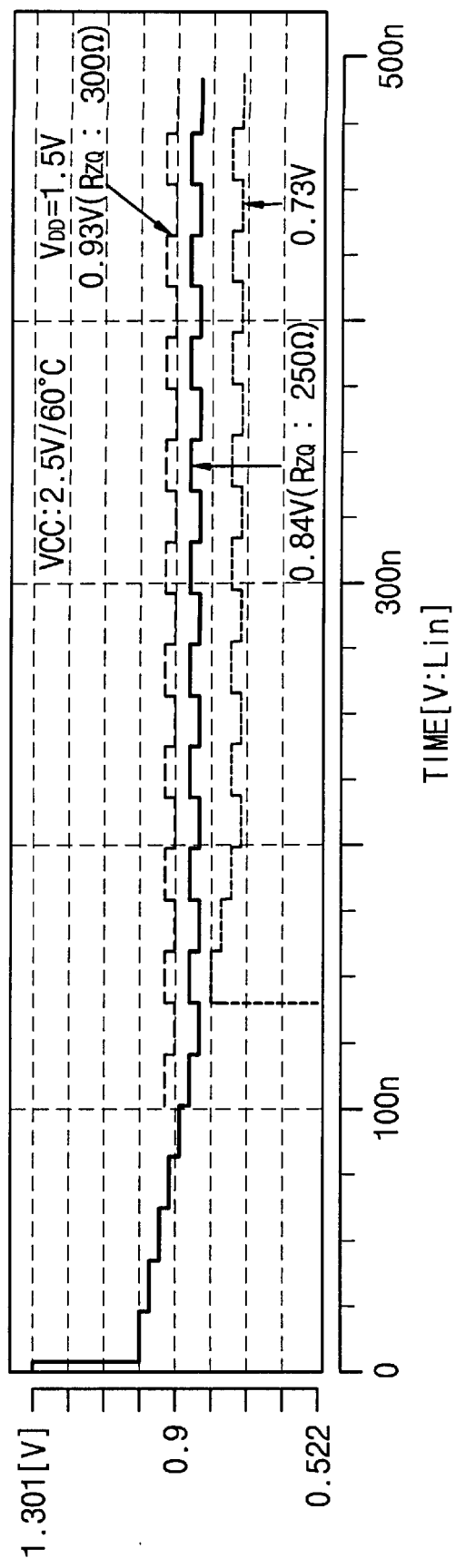
FIG. 2 is a graph for illustrating the changes of the operating points of the MOS transistor with variations of the resistance $R_{ZQ}$ corresponding to the impedance of the bus signal line.

The impedance of the data driver 101 itself is measured under a set condition (for example, with half of the level of the power supplied to the data driver). The on-resistance of the MOS transistors constituting the data driver 101 is thus determined at the point "b" ($V_{DD}/2$), as shown in FIG. 1. In this case, the source voltage $V_{DD}$ is the power suppled to the data driver 101.

Figure 5:
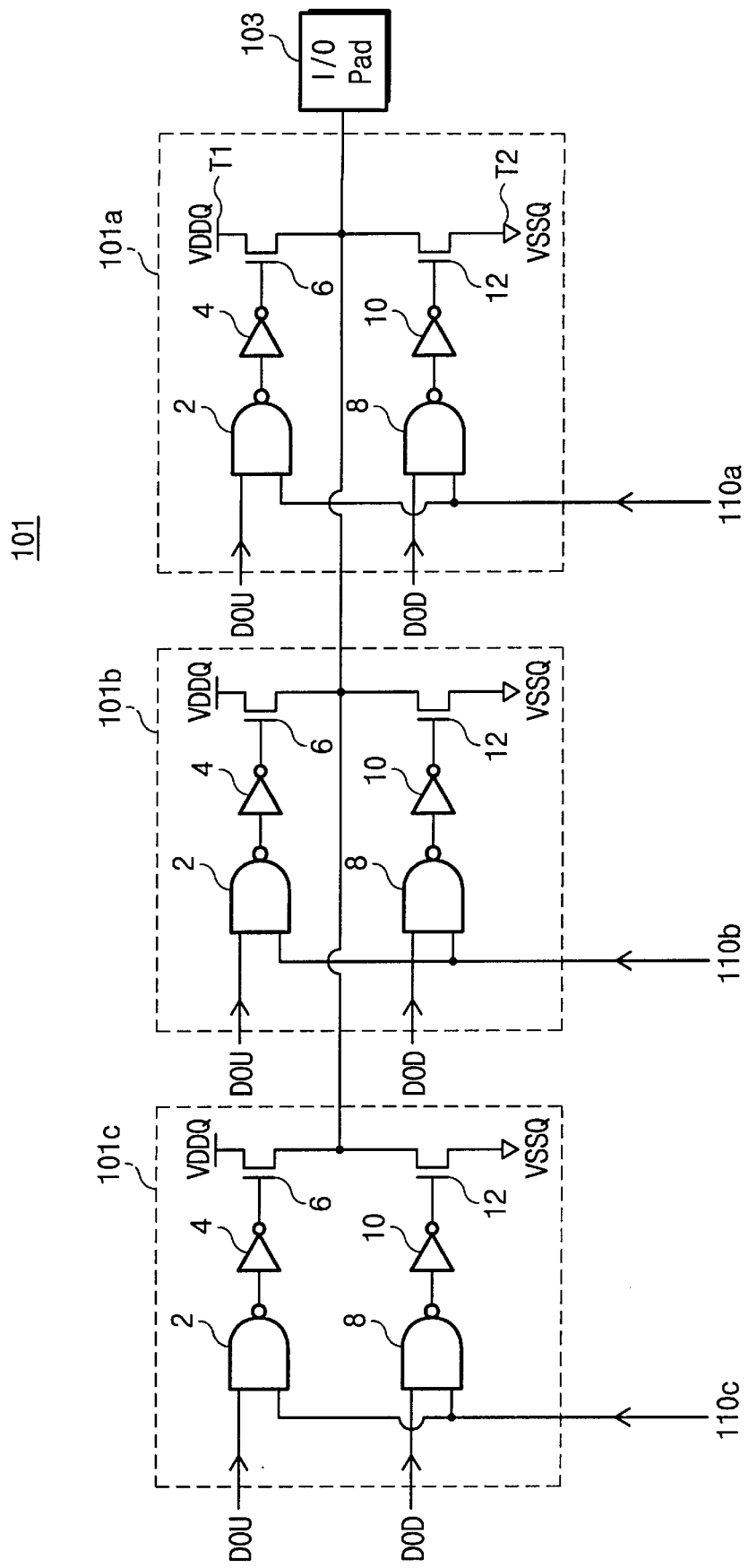
FIG. 5 is a circuit diagram illustrating the data driver shown in FIG. 3.

The data driver 101 itself comprises first, second, and third driver circuits 101a, 101b, and 101c each connected in parallel with the I/O pad 103, as shown in FIG. 5. Each of the drive circuits 101a, 101b, and 101c includes first and second NAND gates 2 and 8, first and second inverters 4 and 10, and first and second NMOS transistors 6 and 12.

The first and second inverters 4 and 10, are respectively connected with the output terminals of the first and second NAND gates has one input commonly connected with one of a first, second, or third code line 110a, 110b, or 110c, and the other input supplied with either the data signal DOU or the data signal DOD. The current paths of the first and second NMOS transistors 6 and 12 are connected in series between the voltage source $V_{DD}$ and ground $V_{SS}$ with their gates connected the first and second inverters 4 and 10, respectively. Each of the first and second NMOS transistors 6 and 12 has one end of its current path commonly connected with the I/O pad 103.

The first through third driver circuits 101a, 101b and 101c are selected to determine the impedance of the data driver 101 according to a combination of the voltage levels on the code lines 110a–110c. For example, if the voltage level combination of the code lines 110a–110c is "101", then the first and third driver circuits 101a and 101c are selected, further adjusting the impedance of the data driver 101.

Figure 4:
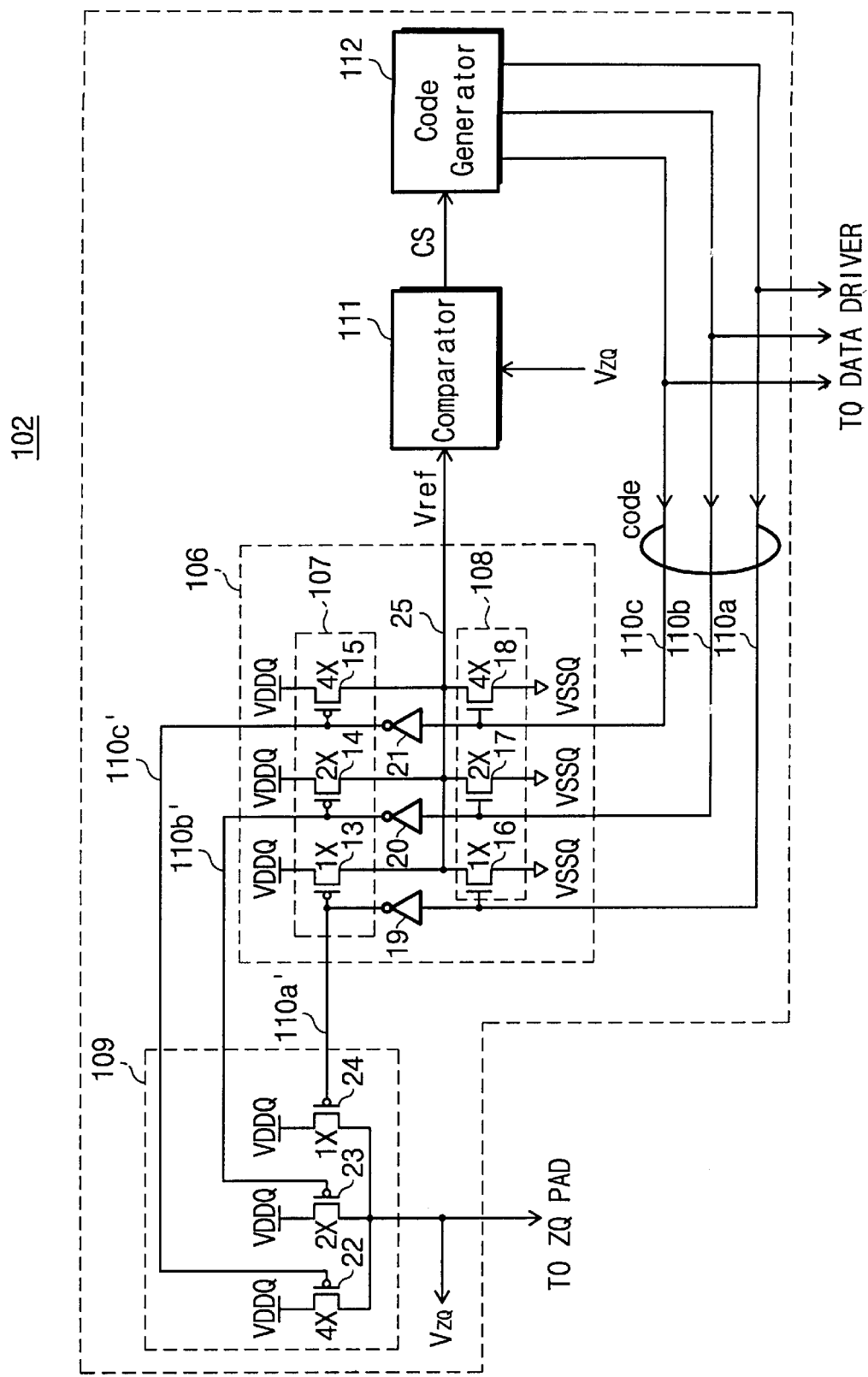
FIG. 4 is a circuit diagram illustrating the impedance adjustment circuit shown in FIG. 3.

Referring to FIG. 4, the impedance adjustment circuit 102 comprises a reference voltage generator 106, a current source 109, a comparator 111, and a code generator 112. The voltage levels of the first through third code lines 110a–110c are set differently depending upon the value of the discrete resistor $R_{ZQ}$ connected to the ZQ pad 104, thereby adjusting the impedance adjustment circuit 102.

The reference voltage generator 106 generates a reference voltage $V_{ref}$, which has the impedance measurement level (for example, $V_{DD}/2$) of the data driver, regardless of the combination of the voltage levels of the code lines 110a–110c. The reference voltage generator 106 includes a first and second transistor arrays 107 and 108, and third through fifth inverters 19, 20, and 21.

In the preferred embodiment, the first transistor array 107 includes three PMOS transistors 13, 14, and 15, whose current paths are connected in parallel between the voltage source $V_{DD}$ and a node 25 for outputting the reference voltage $V_{ref}$. In addition, the gates and are respectively connected with the extensions 110a', 110b' and 110c' of the code lines 110a, 110b, and 110c though the corresponding inverters 19, 20, and 21. The transistors 13, 14, and 15 each have different widths, for example, 1X, 2X, and 4X according to a binary relationship, as shown in FIG. 4.

In this description, the symbol "X" represents the "times" sign, and indicates multiples. In other words, the widths of the transistor 14 and 15 are respectively two and four times the width of the transistor 13.

The second transistor array 108 includes three NMOS transistors 16, 17, and 18, whose current paths are connected in parallel between the node 25 and ground $V_{SS}$, and the gates with the respective code lines 110a, 110b, and 110c. These transistors 16, 17, and 18 also have different widths. Each group of the PMOS and NMOS transistors SEC.0550 13-16, 14-17, 15-18 having the same width are selected together according to the combination of the voltage levels of the code lines 110a–110c.

However, the node 25 is always set to have the level of $V_{DD}/2$ because of corresponding transistor groups each have the same width, so that the reference voltage generator 106 may always generate the reference voltage $V_{ref}$ at the same level of $V_{DD}/2$, regardless of the voltage level combination of the code lines 110a–110c.

The current source 109, which is connected through the ZQ pad 104 to the discrete resistor $R_{ZQ}$, supplies the ZQ pad 104 with a variable current according to the voltage level combination of the code line extensions 110a', 110b', and 110c'. The current source 109 includes three PMOS transistors 22, 23, and 24, whose current paths are connected in parallel between the voltage source $V_{DD}$ and the ZQ pad 104, and whose gates are connected respectively with the code line extensions 110a', 110b', and 110c', whose voltage levels are the inversion of the code lines 110a, 110b, and 110c.

The comparator 111 compares the voltage $V_{ZQ}$ induced in the ZQ pad 104 with the reference voltage $V_{ref}$ to generate a control signal CS to compensate for the difference between $V_{ZQ}$ and $V_{ref}$. The code generator 112 then generates binary logic values to the respective code lines 110a, 110b, and 110c in response to the control signal CS.

Figure 6:
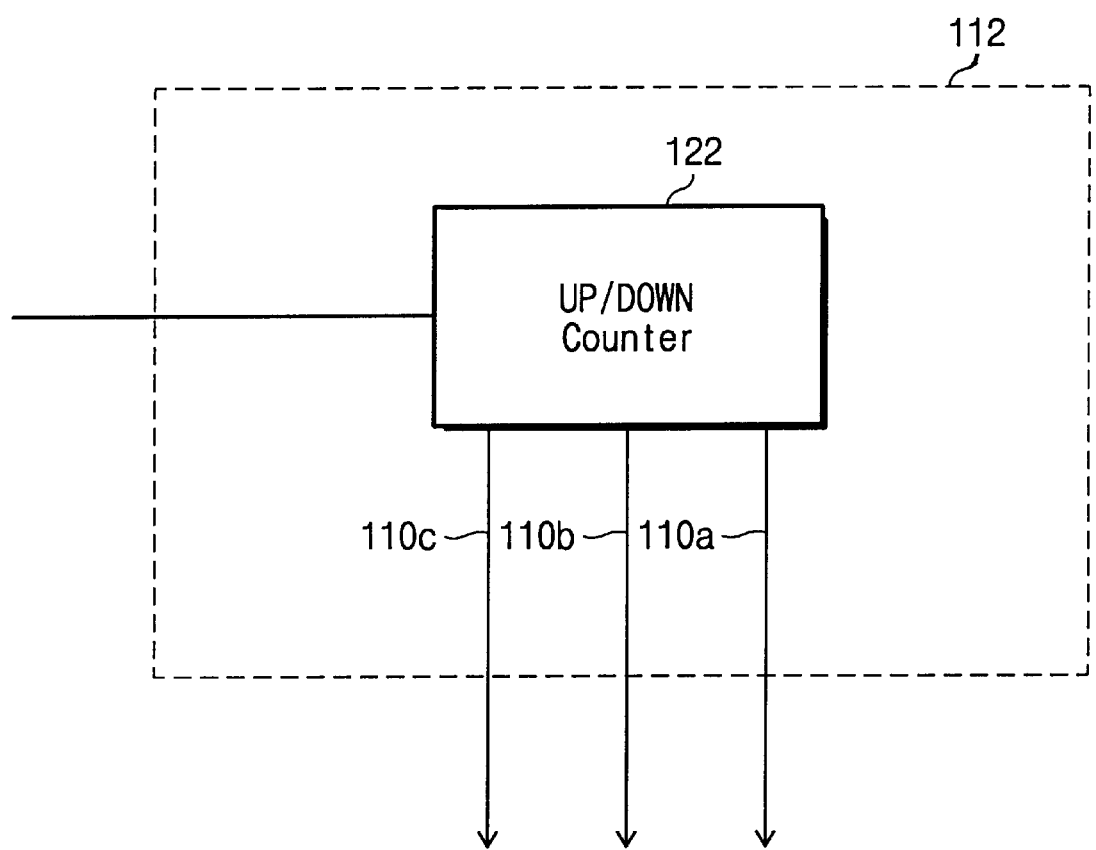
FIG. 6 is a circuit diagram illustrating the code generator shown in FIG. 4.

As shown in FIG. 6, in the present embodiment, the code generator 112 comprises an up/down counter 122. For example, if the induced voltage $V_{ZQ}$ is lower than the reference voltage $V_{ref}$, the control signal CS has a high level and the up/down counter 122 counts up. If the induced voltage $V_{ZQ}$ is higher than the reference voltage $V_{ref}$, the control signal CS has a low level and the up/down converter counts down. Thus, the voltage level combination of the code lines 110a–110c is changed by the up/down counter 122 when the two voltages have different levels, and is otherwise fixed by the up/down counter 122 when the two remain the same. As a result of this design, the impedance of the data driver 101 may be matched with that of the corresponding bus signal line.

Figure 7:
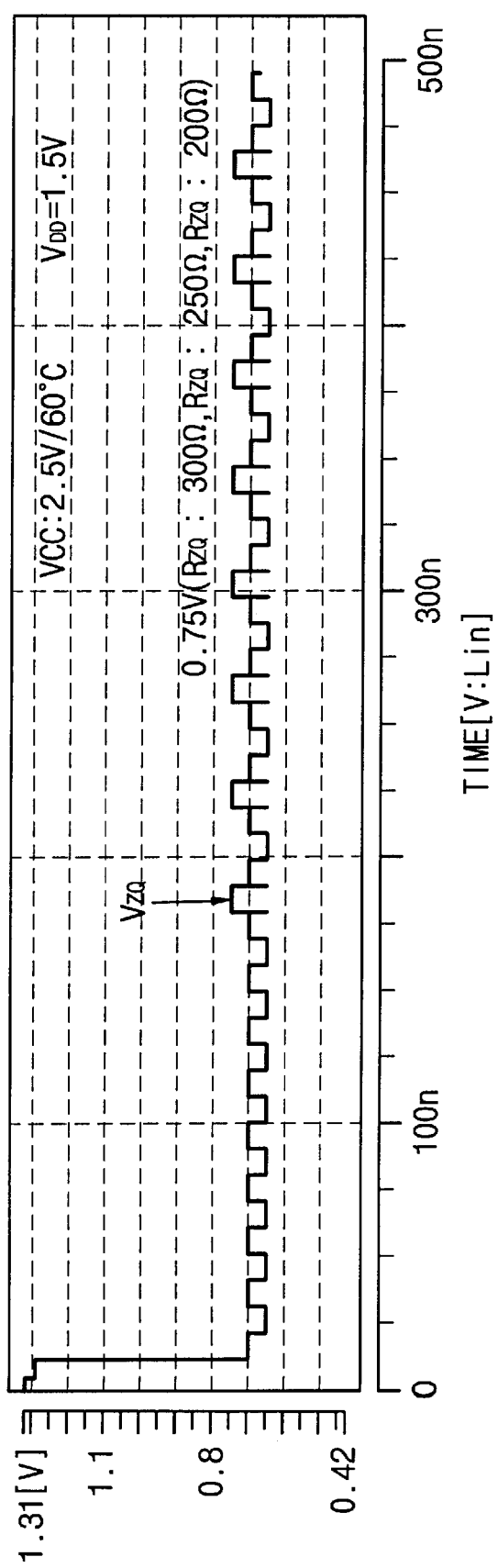
FIG. 7 is a graph for illustrating voltage variations of the ZQ pad with the value of the discrete resistor according to a preferred embodiment of the present invention.

The operation of the inventive circuit will now be described in connection with FIGS. 3 to 6, as well as FIG. 7, which is a graph illustrating voltage variations of the ZQ pad along with the value of the discrete resistor according to the preferred embodiment of the present invention. If the value of the discrete resistor $R_{ZQ}$, corresponding to the bus signal line, is changed, and with it the impedance of the bus signal line, the voltage $V_{ZQ}$ induced in the ZQ pad 104 is also changed. Assuming that the induced voltage $V_{ZQ}$ drops lower than the measured impedance level (for example, $V_{DD}/2$) of the data driver, the comparator 111 generates a control signal CS of a high level by comparing the voltage of the ZQ pad, i.e., $V_{ZQ}$, with the reference voltage $V_{ref}$. Then, the up/down counter 122 of the code generator 112 counts up according to the control signal CS to generate the resultant code signals (for example, three binary logic values) to the respective code lines 110a, 110b, and 110c. According to the voltage level combination of the code lines 110a, 110b, and 110c, the impedance of the data driver 101 becomes smaller than before, and the transistor arrays 107 and 108 also come to have smaller impedances. Then, more of the PMOS–NMOS transistor pairs are conducted. and therefore, the reference voltage generator 106 comes to have a smaller impedance.

As this happens, the reference voltage $V_{ref}$, retains the same level as the impedance measured voltage of the data driver. In addition, more of the PMOS transistors of the current source 109 are conducted according to the changed code signals of the code lines 110a–110c, so that the voltage $V_{ZQ}$ induced in the ZQ pad 104 rises. Such operation is repeated to make the voltage $V_{ZQ}$ of the ZQ pad 104 equal to the impedance measured voltage of the data driver 101.

Conversely, assuming that the voltage $V_{ZQ}$ induced in the ZQ pad 104 increases compared to the impedance-measured level, for example, $V_{DD}/2$, the changed voltage $V_{ZQ}$ is likewise changed to the impedance-measured voltage of the data driver 101.

Thus, even if the value of the resistor $R_{ZQ}$ connected to the ZQ pad 104 is changed, the on-resistance of the MOS transistors constituting the impedance adjustment circuit 102 is determined under the same condition as the designed impedance measured level, for example, $V_{DD}/2$. Namely, as shown in FIG. 1, the values of the on-resistances of the MOS transistors constituting the data driver 101 and impedance adjustment circuit 102 are determined under the impedance measured voltage $V_{DD}/2$ of the data driver 101. In the prior art, the operating point, where the on-resistances of the MOS transistors forming the impedance adjustment circuit 102 are determined, is varied with the value of the resistor $R_{ZQ}$, for example, from the point "b" to the point "c" or "a", so that the on-resistances of the MOS transistors of the impedance adjustment circuit 102 and data driver 101 are determined under different conditions.

However, in the current circuit, the on-resistances of the MOS transistors of the impedance adjustment circuit 102 and data driver 101 are determined under the same condition, namely, the impedance measured voltage $V_{DD}/2$ of the data driver 101. The condition for the code generator 112 to generate the code signals is made the same as the condition $V_{DD}/2$ for the impedance measurement so as to match the impedance of the data driver 101 with the impedance of the bus signal line. This considerably reduces the reflection errors during the signal transfer.

While the present invention has been described in specific embodiments accompanied by the attached drawings, it will be apparent to those skilled in the art that various changes and modifications may be made without departing the gist of the present invention.

What is claimed is:

1. A semiconductor device connected to a bus having a plurality of signal lines, the semiconductor device comprising:
   a resistor having a first end connected to a ground voltage;
   a first pad connected to a second end of the resistor;
   a plurality of second pads respectively connected to the plurality of signal lines;
   a reference voltage generator for generating a reference voltage;
   a comparator for comparing the voltage at the first pad with the reference voltage to generate a control signal;
   a code generator for generating a code signal in response to the control signal;
   a current source for supplying the first pad with a variable current in accordance with the code signal; and
   a data driver for driving data signals onto the signal lines via the second pads in accordance with the code signal.

2. A semiconductor device as recited in claim 1, wherein the resistor is a discrete resistor.

3. A semiconductor device as recited in claim 1, wherein the resistor has a value corresponding to the impedance of the plurality of signal lines, and wherein the code signal is used to match the impedance of the data driver with the impedance of the signal lines.

4. A semiconductor device as recited in claim 1, wherein the code generator includes an up/down counter for generating the code signal, and wherein the code signal has at least two binary logic values.

5. A semiconductor device as recited in claim 4, wherein the reference voltage generator comprises:

a first source terminal for receiving a source voltage;

a second source terminal for receiving a ground voltage;

an output terminal for outputting the reference voltage;

a first transistor array controlled by the binary logic values, a plurality of inverters for inverting the binary logic values, and a second transistor array controlled by the inverted binary logic values.

6. A semiconductor device as recited in claim 5, wherein the first transistor array further comprises a plurality of first MOS transistors connected in parallel between the output terminal and the second source terminal, and wherein the second transistor array further comprises a plurality of second MOS transistors connected in parallel between the first source terminal and the output terminal.

7. A semiconductor device as recited in claim 6, wherein the first MOS transistors are NMOS transistors, and wherein the second MOS transistors PMOS transistors.

8. A semiconductor device as recited in claim 7, wherein the ratio between the NMOS and PMOS transistors is 1:1 and pairs of the NMOS and PMOS transistors have the same on-resistance.

9. A semiconductor device as recited in claim 8, wherein each of the NMOS transistors have different widths.

10. A semiconductor device as recited in claim 8, wherein each of the PMOS transistors have different widths.

11. A semiconductor device as recited in claim 5, wherein the current source further comprises source PMOS transistors connected in parallel between the first source terminal and the first pad, wherein the source PMOS transistors are respecitvely controlled by the outputs of the plurality of inverters, and wherein the source PMOS transistors each have different widths.

12. A semiconductor device as recited in claim 5, wherein the data driver further comprises a plurality of data driver circuits connected in parallel with the plurality of second pads, and wherein the data driver circuits are controlled by the logic values of the code signal.

13. A semiconductor device connected to a bus having of a plurality of signal lines, the semiconductor device comprising:

a discrete resistor corresponding to the impedance of the signal lines;

a first pad connected to the discrete resistor;

a plurality of second pads respectively connected with the signal lines;

an impedance adjustment circuit connected to the first pad to generate a code signal according to the value of the discrete resistor; and a data driver for driving data signals to the signal lines in response to the code signal, the impedance of the data driver being adjusted to have the same value as that of the signal lines.

14. A semiconductor device as recited in claim 13, wherein the impedance adjustment circuit further comprises a reference voltage generator for generating a reference voltage;

a current source for supplying the first pad with variable current according to the code signal;

a comparator for comparing the voltage at the first pad with the reference voltage to generate a control signal; and a code generator for generating the code signal in accordance with the control signal.

* * * * *